United States Patent
vor dem Brocke et al.

(10) Patent No.: US 11,335,538 B2
(45) Date of Patent: May 17, 2022

(54) DEVICE AND METHOD FOR FILTERING MULTIPLE PULSE SIGNALS

(71) Applicant: Comet AG, Flamatt (CH)

(72) Inventors: Manuel vor dem Brocke, Bramsche (DE); Roland Schlierf, Frechen (DE)

(73) Assignee: COMET AG PLASMA CONTROL TECHNOLOGIES, Flamatt (CH)

( * ) Notice: Subject to any disclaimer, the term of this patent is extended or adjusted under 35 U.S.C. 154(b) by 0 days.

(21) Appl. No.: 16/936,865

(22) Filed: Jul. 23, 2020

(65) Prior Publication Data
US 2021/0027989 A1    Jan. 28, 2021

(30) Foreign Application Priority Data
Jul. 23, 2019  (EP) .................................... 19187829

(51) Int. Cl.
*H03K 19/20* (2006.01)
*H01J 37/32* (2006.01)

(52) U.S. Cl.
CPC ........ *H01J 37/32146* (2013.01); *H03K 19/20* (2013.01); *H01J 2237/334* (2013.01)

(58) Field of Classification Search
CPC ........ H03K 19/20; H03K 5/1252; H03K 7/08; H03K 5/13; H03K 5/135; H03K 5/153; H03H 17/04; H03H 7/40
See application file for complete search history.

(56) References Cited

U.S. PATENT DOCUMENTS

| | | | | |
|---|---|---|---|---|
| 4,646,097 A | * | 2/1987 | King | G01S 13/787 342/134 |
| 5,926,455 A | * | 7/1999 | Allpress | H03H 17/0277 370/210 |
| 5,937,330 A | * | 8/1999 | Vince | H04N 7/17309 725/125 |
| 2018/0123576 A1 | | 5/2018 | Chan | |

FOREIGN PATENT DOCUMENTS

| EP | 2511778 A2 | 10/2012 |
|---|---|---|
| WO | 9610867 A1 | 4/1996 |

OTHER PUBLICATIONS

European Office Action for Application No. 19187829.7-1206 dated Jan. 16, 2020.

\* cited by examiner

*Primary Examiner* — John W Poos
(74) *Attorney, Agent, or Firm* — Tarolli, Sundheim, Covell & Tummino LLP

(57) ABSTRACT

The invention relates to a filter unit for filtering multiple pulse signals comprising a number of filter circuits, which are connected in parallel. Each filter circuit comprises an input and an output, wherein the input is configured to receive an amplitude of an input signal and the output is configured to activate an output signal. Each filter circuit has an allocated filter level and further comprises a pulse level detection circuit configured to detect a change of state of a pulse level of the input signal. The change of state comprises a transition from a first pulse level to a second pulse level and if the pulse level corresponds to the allocated filter level of the filter circuit the output of said filter circuit is activated.

14 Claims, 4 Drawing Sheets

DEVICE AND METHOD FOR FILTERING MULTIPLE PULSE SIGNALS

RELATED APPLICATIONS

Figure 1:
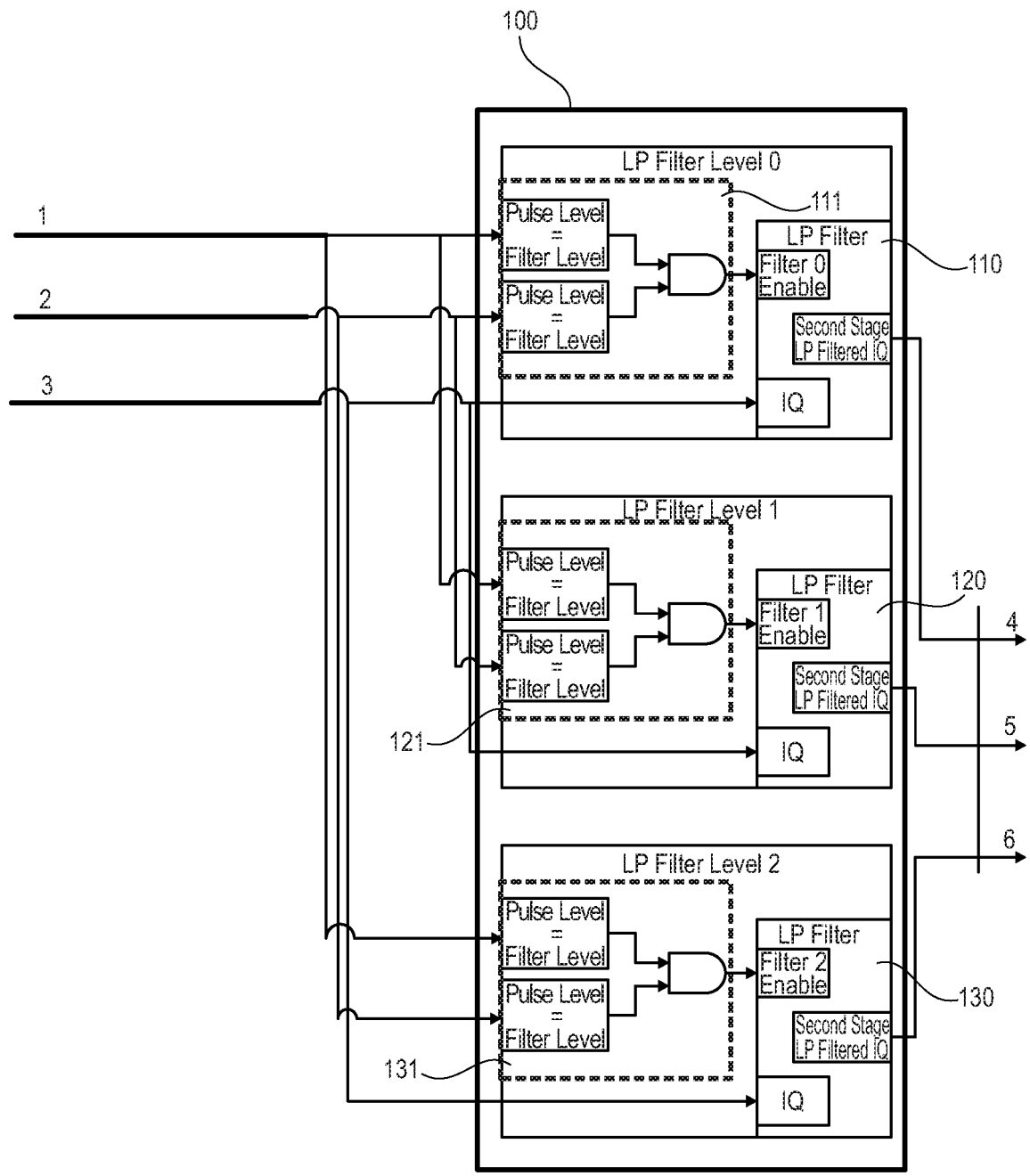

The present invention is a Nonprovisional Application under 35 USC 111(a), claiming priority to Serial No. EP 19187829.7, filed on 23 Jul. 2019, the entirety of which is incorporated herein by reference.

The invention relates to a filter unit for filtering multiple pulse signals comprising a number of filter circuits, which are connected in parallel. Each filter circuit comprises an input and an output, wherein the input is configured to receive an amplitude of an input signal and the output is configured to activate an output signal. Each filter circuit has an allocated filter level and further comprises a pulse level detection circuit configured to detect a change of state of a pulse level of the input signal. The change of state comprises a transition from a first pulse level to a second pulse level and if the pulse level corresponds to the allocated filter level of the filter circuit the output of said filter circuit is activated.

Further, the invention relates to a method for filtering multiple pulse signals, wherein a filter unit comprises a number of filter circuits, which are connected in parallel. Each filter circuit comprises an input and an output. The input is configured to receive an amplitude of an input signal and the output is configured to activate an output signal. Each filter circuit has an allocated filter level and further comprises a pulse level detection circuit. The method comprises the steps of detecting a change of state of a pulse level of the input signal, and if the pulse level corresponds to the allocated filter level of the filter circuit-activating the output of the allocated filter circuit.

Furthermore, the invention relates to a filter unit for filtering multiple pulse signals comprises means to store data into a memory device. A filter circuit comprising at least one input and an output. The at least one input is configured to receive an amplitude of the input signal and the output is configured to output signal information to the memory device. The filter circuit has, at a given time ($t_1$), an allocated filter value ($fv_1$). The filter circuit further comprises at least one pulse level detection circuit arranged to detect a change of state of a prevailing pulse level of the input signal. The change of state may comprise a transition from a first pulse level to a second pulse level. If the prevailing pulse level corresponds to the allocated filter value ($fv_1$) of the filter circuit, the output and the state of that filter circuit are stored in a memory $m_1$ of the memory device and the allocated filter value of the filter circuit is changed to a new value ($fv_2$) in order to detect a different change of state of a prevailing pulse level at a time $t_2$ later than $t_1$.

Radio frequency (RF) generators are well known to provide power in a variety of applications, including in plasma tools for the fabrication of semiconductors (e.g. deposition, etching and modification of thin films).

RF generators can also be used in medical devices (e.g. electrosurgical devices and medical imaging machines such as magnetic resonance imaging, MRI, machines), in food packaging, in commercial surface modifications and coatings.

A specially demanding application is that of supplying power to generate and control plasma processing steps due to the complexity of plasma constituents (ions, electrons, neutral atoms and reactive species) which are typically confined inside a dedicated plasma processing chamber. In conventional plasma etching for example, continuous-wave RF power (so-called "CW RF power") is delivered to the plasma processing chamber. RF generally refers to frequencies in the range 20 kHz to 300 GHz; however more specific frequencies are typically employed in industrial plasma processes and include in particular 2 MHz, 6.78 MHz, 13.56 MHz, 27.12 MHz, 40.68 MHz, or/and any other appropriate frequency or combination of frequencies.

Irrespective of the frequency employed, one problem with using continuous-wave RF power for plasma processing is that charge-up damage may occur. Delivering pulsed power instead of continuous-wave RF power prevents charge from building up and can mitigate charge-up damage effects. Systems for delivering pulsed power signals are known in the prior art.

However, these systems suffer from various defects and disadvantages. One technical problem area is that prior art systems do not address the complexities and difficulties in accurately measuring power delivered by a pulsed signal. This can lead to inaccurate repeatability of a critical processing step. As an example, the pulse time duration of generated pulses is limited especially with regard to short pulses due to the existing filters in such power generators. Indeed, filters need to be settled and activated to allow accurate power measurements of the necessary pulses. Thus, the settling time of filters often has a negative influence on the pulse duration, as it does not allow sufficiently accurate measurements within short pulses. In other words, with the prior art systems, longer pulses have to be accepted than actually desired for the manufacturing process or a generally less accurate measurements and therefore power controlled power have to be accepted.

Therefore, being able to realize filters with faster settling times would no longer restrict pulse duration and consequently would allow supplying accurate pulsed power in a well-controlled manner, also when supplying very short pulses. Very short pulses are beneficial, especially for powering the most demanding plasma processing tools used in manufacturing of semi-conductors.

Object of the invention is to provide a filter unit and a method reducing the settling time of a filter and provide better measurements of pulse properties for plasma processing, in particular for plasma etching processes.

According to a first aspect of the invention this object is solved by a filter unit for filtering multiple pulse signals. The filter unit comprises a number of filter circuits, which are connected in parallel to each other. Each filter circuit comprising an input and an output. The input is configured to receive an amplitude of an input signal and the output is configured to activate an output signal. Each filter circuit has an allocated filter level and further comprises a pulse level detection circuit configured to detect a change of state of a pulse level, wherein the change of state comprises a transition from a first pulse level to a second pulse level. If the pulse level corresponds to the allocated filter level of the filter circuit the output of said filter circuit is activated.

This allows to significantly reduce the settling time of the filter unit because the filter is in a steady state. Further, this allows a better and faster measurement regarding the amplitude of the input signal. The filter unit advantageously enables to measure pulses which have a shorter duration than the settling time of the filter circuits.

In a first embodiment according to the first aspect of the invention the number of filter circuits corresponds to the number of pulse levels of the input signal.

This allows adapting advantageously the reduction of the overall settling time of the filter unit to the varying or dynamic usage of necessary pulse levels e.g. for transferring the pulsed energy to a plasma.

In a second embodiment according to the first aspect of the invention the number of filter circuits corresponds to the number of pulse level transitions of the multi-pulse signal.

This allows a dynamic reduction of the settling time of the filter unit depending on multiple pulse level transitions, e.g. transitions from a first "non zero" pulse level to a further "non zero" pulse level.

In a third embodiment according to the first aspect of the invention the pulse level detection circuit and/or at least one of the filter circuits comprise logical gate elements.

This allows to advantageously increase the signalling process speed of the filter circuit to reduce the settling time of the filter unit.

In a fourth embodiment according to the first aspect of the invention the pulse level detection circuit comprises at least one AND gate arranged to receive at least one pulse level and at least one allocated filter level.

In a fifth embodiment according to the first aspect of the invention the pulse level detection circuit and/or the at least one of the filter circuits is configured as a field programmable gate array (FPGA) or other programmable logical elements.

This allows a fast measuring process of level pulsing.

In a sixth embodiment according to the first aspect of the invention the pulse level detection circuit is connected to a further input of the filter unit and the input is arranged to enable the output signal at the output of the filter unit.

In a seventh embodiment according to the first aspect of the invention the filter unit further comprises a multiplexer, which is connected to the output of the filter circuits.

This allows a reduction of the global Settling Time of the final outputs by multiplexing selection the necessary output signal for transferring pulsed energy to an application, for example to a plasma processing application.

In an eighth embodiment according to the first aspect of the invention the filter unit is serially connected to at least one further filter unit.

In a ninth embodiment according to the first aspect of the invention the number of filter circuits is 4.

Such an arrangement is very advantageous when implementing the filter for a dual-pulse level RF generator as it provides a simple filter unit with a limited number of filter circuits whilst still providing enough filters for all possible changes of states of that particular pulsed signal.

In a tenth embodiment according to the first aspect of the invention the number of filter circuits is 8.

This arrangement is an especially good configuration compromise between a moderately complex filter unit and a truly multiple-level pulsing (more than 3 non-zero levels).

It should be appreciated however, that the number of filter circuits used in the filter unit of the present invention is not limited per se. Depending on the number of pulsing levels and the number of transitions (often referred to as "change of states") between these pulsing levels, a device according to the invention can comprise numerous (n≥8 or even n≥24) filter circuits. As an illustrative example, one can envisage an advanced RF generator to output RF power with pulses of various amplitudes and various short durations and it would require a filter unit capable of handling in a fast manner a large number of changes of states of the RF power signal supplied to, for example a plasma process. The benefits of such an advanced multi-pulse RF generator compared to a continuous-wave RF generator resides in the fact that the plasma constituents can be better controlled. Basically it offers more "knobs" for adjusting the plasma processing tool when powered by such a generator. The filter device of the present invention improves such advanced generators thanks to the short pulse duration capabilities.

In an eleventh embodiment according to the first aspect of the invention the filter unit further comprises means to store data into a memory device.

The memory device advantageously enables the historical storage of data related to pulses, pulse levels, activation period or settling time. This memory device as part of the filter unit can be realized as a digital device or an analog device.

In a twelfth embodiment according to a second aspect of the invention a filter unit for filtering multiple pulse signals comprises means to store data into a memory device. A filter circuit comprises at least one input and an output, wherein the at least one input is configured to receive an amplitude of the input signal and the output is configured to output signal information to the memory device. The filter circuit has, at a given time (t1), an allocated filter value (fv1) and further comprises at least one pulse level detection circuit arranged to detect a change of state of a prevailing pulse level of the input signal. The change of state may comprise a transition from a first pulse level to a second pulse level, and if the prevailing pulse level corresponds to the allocated filter value (fv1) of the filter circuit, the output and the state of that filter circuit are stored in a memory m1 of the memory device. The allocated filter value of the filter circuit is changed to a new value (fv2) in order to detect a different change of state of a prevailing pulse level at a time t2 later than t1.

According to a third aspect of the invention a method for filtering multiple pulse signals is provided, wherein a filter unit comprises a number of filter circuits, which are connected in parallel. Each filter circuit comprises an input and an output. The input is configured to receive an amplitude of an input signal and the output is configured to activate an output signal. Each filter circuit has an allocated filter level and further comprises a pulse level detection circuit. The method comprises the steps of detecting a change of state of a pulse level of the input signal, and if the pulse level corresponds to the allocated filter level of the filter circuit activating the output of the allocated filter circuit.

This allows to significantly reduce the settling time of the filter unit because the filter is in a steady state.

Figure 2:
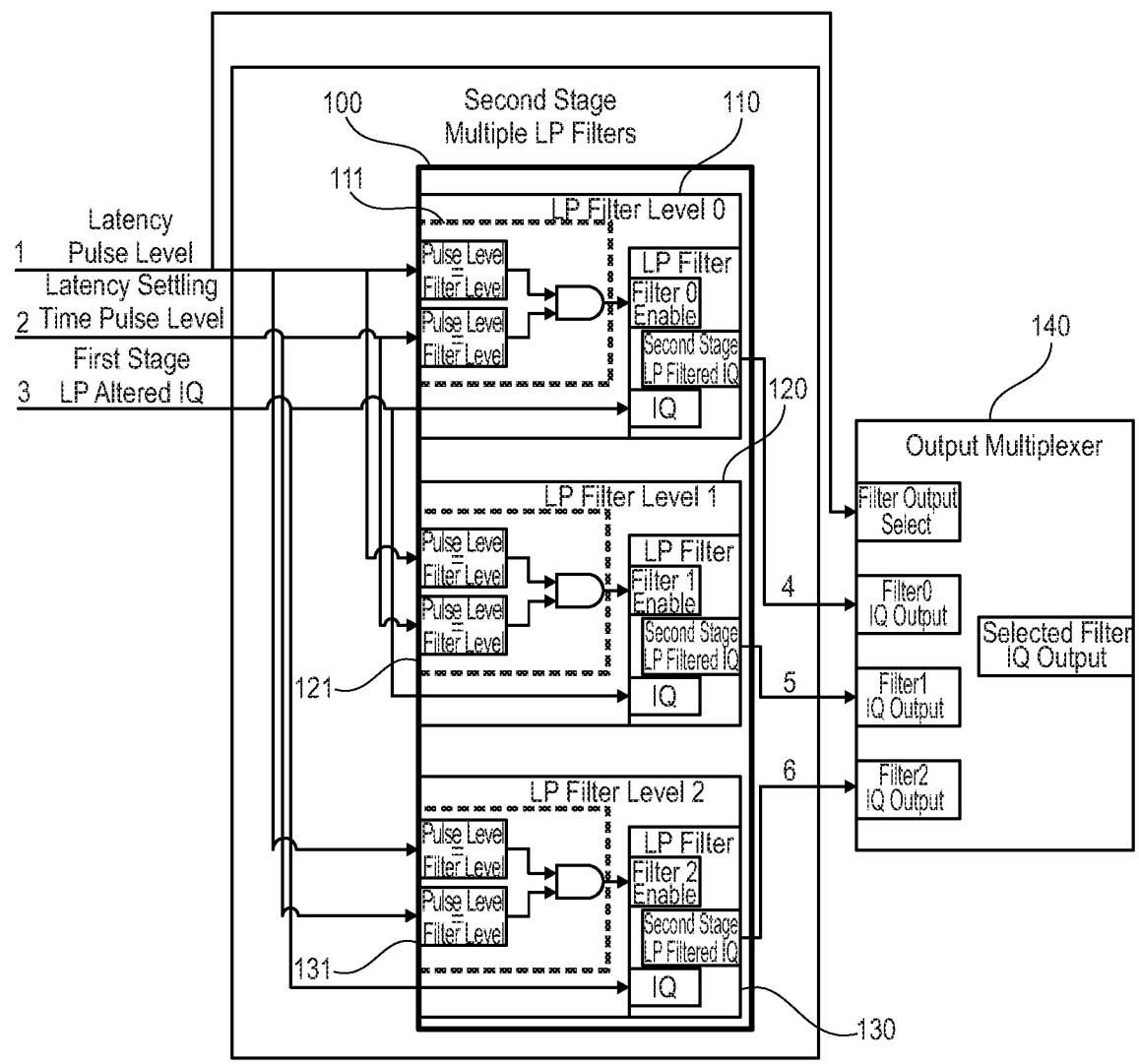
Figure 3:
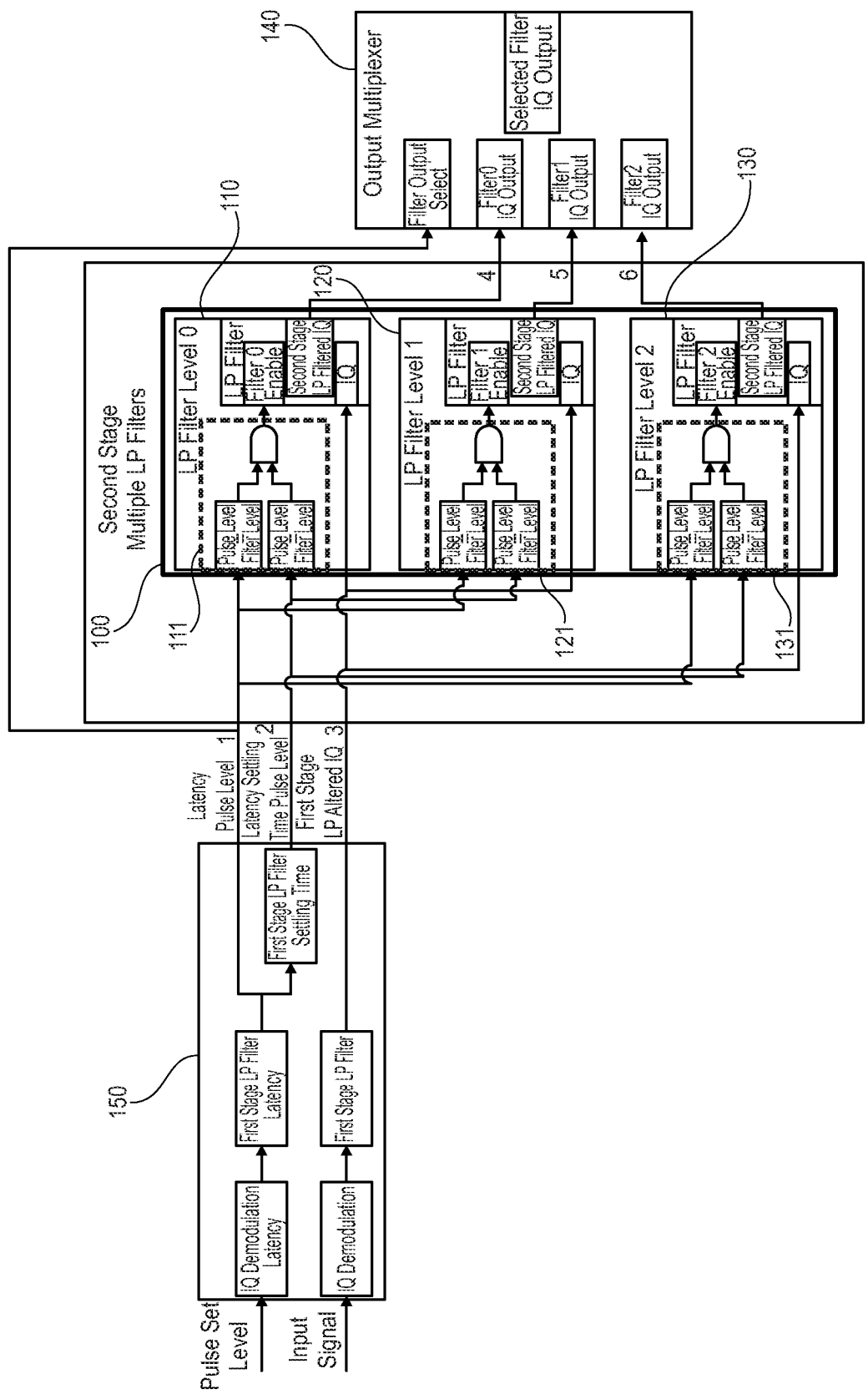
Figure 4:
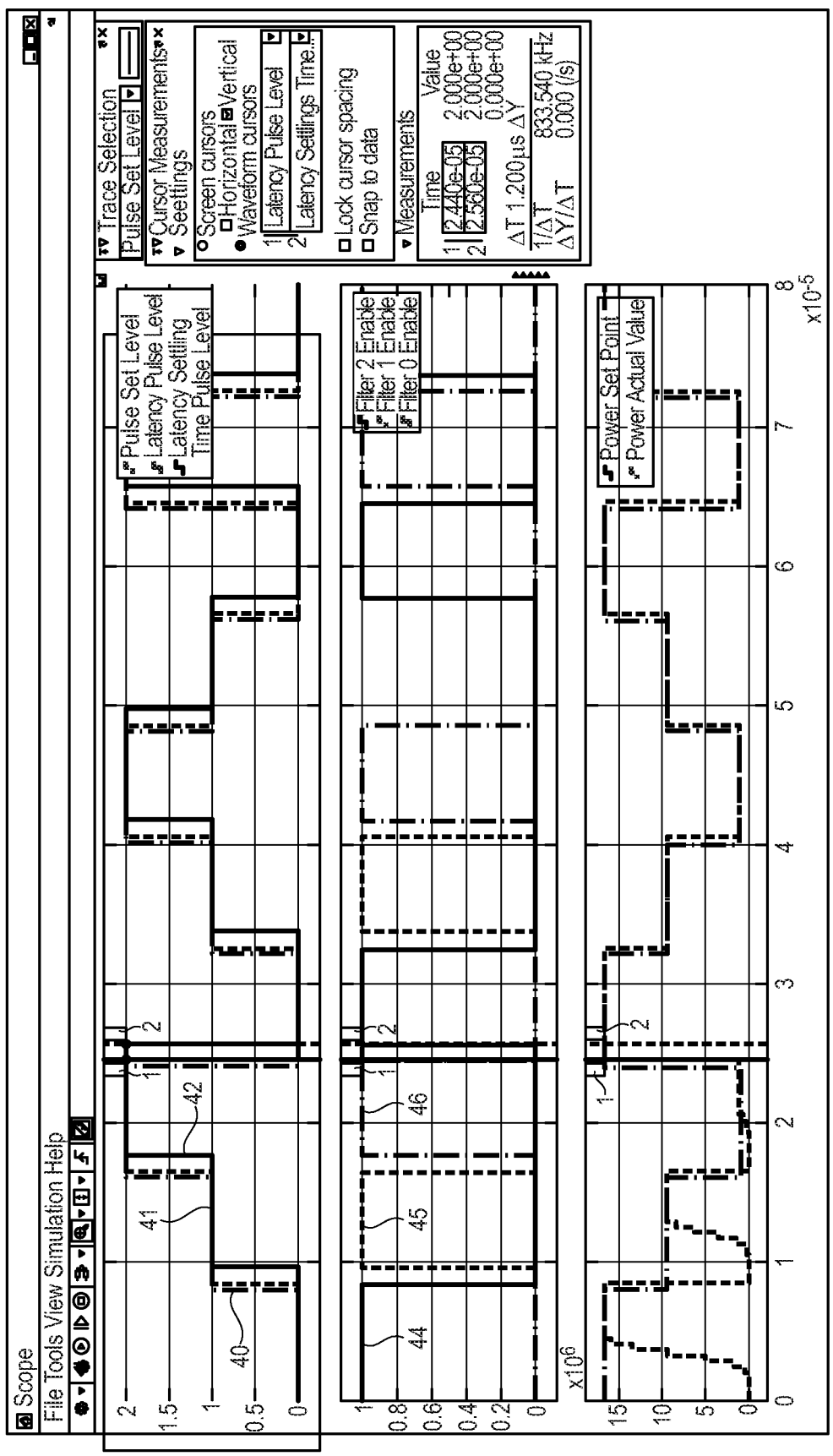

The invention will be described below with reference to different exemplary embodiments explained in detail in the following drawings:

FIG. 1 depicts a schematic diagram of an embodiment of a filter unit according to the present invention, FIG. 2 depicts a schematic diagram of a further embodiment of the filter unit according to the present invention, FIG. 3 depicts a schematic diagram of a further embodiment of the filter unit according to the present invention, FIG. 4 depicts simulation results of the states of filter circuits and the power measurement of output signals of an embodiment of the filter unit according to the present invention, FIG. 1 depicts a schematic diagram of an embodiment of a filter unit 100 according to the present invention comprising three filter circuits 110, 120, 130, which are connected in parallel. It also shows the concept for a multiple level pulsing in an example case of three levels. There is no theoretical limitation to the number of levels or filter circuits. Optionally, it is also possible to configure or set up a filter unit 100 with 4 or 8 filter circuits or any other number n.

Each filter circuit 110, 120, 130 receives three different input signals.

The first input signal is the latency pulse level signal 1. This signal 1 is based on a pulse set level input signal (not shown in FIG. 1), which is delayed by a IQ demodulation latency time and a first stage filter latency time (not shown in FIG. 1).

The second input signal, which is latency settling time pulse level signal 2 is delayed by a settling time of a first stage filter (not shown in FIG. 1).

The third input signal, which is the first stage level pulsing (LP) filtered IQ signal 3, is based on the input signal (not shown), which signal is modified by an IQ demodulation filter and a first stage level pulsing (LP) filter. This signal is related to the amplitude of the input signal.

These three input signals represent the inputs for each filter circuit 110, 120, 130 of the filter unit 100.

The latency pulse level signal 1 and the latency settling time pulse level signal 2 are compared with regard to a pulsing filter level.

This comparison is efficiently performed by the pulse level detection circuit, which is configured to detect a change of state of a pulse level of the input signal. The change of state comprises a transition from a first pulse level to a second pulse level.

For example, such a change of state can be change from a "pulse on" mode to a "pulse off" mode. Each mode comprises an associated pulse level and an associated amplitude of the pulse level. Therefore, such a change may also be a change of state from a "non zero" pulse level to another "non zero" pulse level. "Non zero" is defined by a positive or negative amplitude value of the pulse level, which is not equal to a zero value.

Functionally, in case a new pulse level arises, the filter unit 100 comprising the filter circuits 110, 120, 130 is disabled during the settling time of the first stage filter. During this settling time, the state of the filter unit 100 and therefore the state of each filter circuit 110, 120, 130 is halted. The IQ Output signals 4, 5, 6 of the filter unit 100 keep their last calculated values, which were obtained at the end of the last enabled state of a filter circuit 110, 120, 130.

After the settling time period of the first stage filter, the filter unit 100 comprising the filter circuits 110, 120, 130 is enabled. Now, the values of the IQ Output signals 4, 5, 6 are calculated and adapted according to the specific filter characteristics of each filter circuit 110, 120, 130.

The filter characteristics of a filter circuit 110, 120, 130 comprises for example the configuration or design of the filter circuit 110, 120, 130 or configuration or design of the pulse level detection circuit 111, 121, 131.

At least one of the filter circuits 110, 120, 130 and/or the pulse level detection circuit comprise logical gate elements for calculating the IQ output signals 4, 5, 6.

As an example each one of or at least one of the pulse level detection circuits 111, 121, 131 optionally comprises one AND gate arranged to receive at least one pulse level and at least one allocated filter level. An allocated filter level is one of the filter characteristics.

Optionally, the pulse level detection circuit and/or the at least one of the filter circuits is configured as a field programmable gate array (FPGA) or other programmable logical elements.

The pulse level detection circuit 111, 121, 131 is connected to a further input of the filter unit 100 and the input is arranged to enable the output signal at the output of the filter unit 100. As shown in FIG. 1 the further input is a "filter enable" unit, which is configured to enable the provision of the output signal 4, 5, 6 of the filter unit 100.

After the settling time has passed and only in case the pulse level is equal to the allocated filter level of the pulse level detection circuit 111, 121, 131 the respective filter circuit 110, 120, 130 can be enabled to provide one of the IQ output signals 4, 5, 6. The remaining filter circuits 110, 120, 130 will be disabled or are in a halted state.

In a further embodiment the filter unit 100 for filtering multiple pulse signals comprises means to store data into a memory device 112, 122, 132 (not shown). A filter circuit 110, 120, 130 comprising at least one input and an output. The at least one input is configured to receive an amplitude of the input signal 3 and the output is configured to output signal information to the memory device 112, 122, 132. The filter circuit 110, 120, 130 has, at a given time ($t_1$), an allocated filter value ($fv_1$). The filter circuit 110, 120, 130 further comprises at least one pulse level detection circuit 111, 121, 131 arranged to detect a change of state of a prevailing pulse level of the input signal. The change of state may comprise a transition from a first pulse level to a second pulse level. If the prevailing pulse level corresponds to the allocated filter value ($fv_1$) of the filter circuit, the output and the state of that filter circuit 110, 120, 130 are stored in a memory $m_1$ of the memory device 112, 122, 132 and the allocated filter value of the filter circuit 110, 120, 130 is changed to a new value ($fv_2$) in order to detect a different change of state of a prevailing pulse level at a time $t_2$ later than $t_1$.

In the above embodiments a method for filtering multiple pulse signals is provided. wherein a filter unit 100 comprises a number of filter circuits 110, 120, 130, which are connected in parallel. Each filter circuit 110, 120, 130 comprises an input and an output. The input of the filter unit 100 is configured to receive an amplitude of an input signal 3 and the output is configured to activate an output signal 4,5,6 as depicted in FIG. 1 and FIG. 2. Each filter circuit 110, 120, 130 has an allocated filter level, for example, level zero to level 2 as shown in FIG. 1 and FIG. 2. Each filter circuit 110, 120, 130 further comprises a pulse level detection circuit 111, 121, 131. The detection circuit 111, 121, 131 detects a change of state of a pulse level of the input signal, and if the pulse level corresponds to the allocated filter level of the filter circuit 110, 120, 130 the filter unit 100 activates the output of the allocated filter circuit 110, 120, 130.

FIG. 2 schematically depicts a further embodiment of the filter unit 100 according to the present invention. Same components and signals depicted in the figures or embodiments contain the same reference signs for an easier overview.

As shown in FIG. 2 this embodiment of the filter unit 100 again comprises three filter circuits 110, 120, 130, which are connected in parallel like already explained regarding FIG. 1.

In this embodiment the filter unit 100 further comprises a multiplexer for multiplexing the output signals 4, 5, 6 of the filter unit 100. The multiplexer 140 is configured to receive four input signals. These four signals comprise the IQ Output signals 4, 5, 6 as already explained in FIG. 1 and the latency pulse level signal 1.

FIG. 2 also depicts the concept for a multiple level pulsing in an example case of three levels and multiplexing the outputs. There is no theoretical limitation to the number of levels or filter circuits.

In FIG. 2 the filter circuits 110, 120, 130 and the pulse level detection circuits 111, 121, 131 are designed or are configured in the same way as explained in FIG. 1. The same applies to each of the functions of these circuits, which are already described according to FIG. 1.

In this embodiment functionally after the settling time period of a first stage filter has elapsed, the filter unit 100 comprising the filter circuits 110, 120, 130 is enabled. Now, the values of the IQ Output signals 4, 5, 6 are calculated and adapted according to the specific filter characteristics of each filter circuit 110, 120, 130.

Only in case the actual selected pulse level is equal to the allocated filter level of the pulse level detection circuit 111, 121, 131, the respective filter circuit 110, 120, 130 can be enabled to provide one of the IQ output signals 4, 5, 6. The remaining filter circuits will be disabled or in halted state.

The filter characteristics of a filter circuit 110, 120, 130 comprises for example the configuration or design of the filter circuit 110, 120, 130 or configuration or design of the pulse level detection circuit 111, 121, 131.

At least one of the filter circuits 110, 120, 130 and/or the pulse level detection circuit comprise logical gate elements for calculating the IQ output signals 4, 5, 6.

As an example each one of or at least one of the pulse level detection circuits 111, 121, 131 optionally comprises one AND gate arranged to receive at least one pulse level and at least one allocated filter level. An allocated filter level is one of the filter characteristics.

Optionally, the pulse level detection circuit and/or the at least one of the filter circuits is configured as a field programmable gate array (FPGA) or other programmable logical elements.

The pulse level detection circuit 111, 121, 131 is connected to a further input of the filter unit 100 and the input is arranged to enable the output signal at the output of the filter unit 100. As shown in FIG. 2 the further input is a "filter enable" unit, which is configured to enable the provision of the output signal 4, 5, 6 of the filter unit 100.

FIG. 3 depicts a further embodiment of the filter unit 100 according to the present invention. Same components and signals depicted in the figures or embodiments contain the same reference signs for an easier overview.

In FIG. 3 the filter circuits 110, 120, 130 and the pulse level detection circuits 111, 121, 131 are designed or are configured in the same way as explained in FIG. 1 or FIG. 2. The same applies to each of the functions of these circuits, which are already described according to FIG. 1 or FIG. 2.

In addition to FIG. 1 and FIG. 2, in this embodiment in FIG. 3, as an option, the filter unit 100 accordingly to the present invention is serially connected to a further filter unit. As shown in FIG. 3, this further filter unit is as an example a first stage level pulsing filter unit 150.

The first input signal of the filter unit 150 is the latency pulse level signal 1. This signal 1 is based on a pulse set level input signal (not shown in FIG. 1), which is delayed by a IQ demodulation latency time and a first stage filter latency time (not shown in FIG. 1).

The second input signal, which is latency settling time pulse level signal 2 is delayed by a settling time of a first stage filter.

The third input signal, which is the first stage level pulsing (LP) filtered IQ signal 3, is based on the input signal I, which signal is modified by an IQ demodulation filter and a first stage level pulsing (LP) filter.

These three input signals represent the inputs for each filter circuit 110, 120, 130 of the filter unit 100.

FIG. 4 depicts simulation results for an example embodiment of a filter unit 100 with 3 pulse levels and 3 filter circuits 110, 120, 130.

In this example, the pulse level duration is 8 μs. The middle curves 44, 45, 46 show how the filter circuits 110, 120, 130 are activated ("enabled") in relation to the pulse levels shown on the top curves 40, 41, 42 (upper diagram). Each filter circuit 110, 120, 130 is initialized during the first cycle of its corresponding pulse level, which in FIG. 4 corresponds to the initial 24 μs.

The bottom curves (lower diagram) then show power set points for each pulse level 40, 41, 42 and the actual power value. One can see that the actual power value corresponds to the set point values with a delay reduced to only 0.45 μs. It can also be seen that during the 3 initialization pulses, the delay was of the order of 4 μs. The reduced time of 0.45 μs corresponds to the system latency (independent of the filter itself), as can be seen when comparing bottom curves with top curves, meaning that the settling time has been effectively reduced to 0 μs. In a real case instead of this simulation, that value may be non-zero but it will be very small.

It should be expressly noted that one subject matter of invention can be advantageously combined with another subject matter of the above aspects of the invention and/or with features shown in the drawings, namely either individually or in any combination cumulatively.

LIST OF REFERENCE SIGNS

1 Latency pulse level signal
2 Latency settling time pulse level signal
3 First stage level pulsing (LP) filtered IQ signal
4 IQ output signal
5 IQ output signal
6 IQ output signal
40 Pulse Set Level
41 Latency Settling Time Pulse Level
42 Latency Pulse Level
44 Pulse curve filter circuit 0
45 Pulse curve filter circuit 1
46 Pulse curve filter circuit 2
100 Filter Unit, second stage LP filter
110 Filter circuit, Level Filter Level 0
111 Pulse level detection circuit
112 Memory Device
120 Filter Circuit, Level Filter Level 1
121 Pulse level detection circuit
122 Memory Device
130 Filter Circuit, Level Filter Level 2
131 Pulse level detection circuit
132 Memory Device
140 Multiplexer
150 Further Filter Unit, first stage LP filter

The invention claimed is:
1. Filter unit for filtering multiple pulse signals comprising:
a number of filter circuits, which are connected in parallel, each filter circuit comprising an input and an output, wherein the input is configured to receive an amplitude of an input signal and the output is configured to activate an output signal,
characterized in that,
each filter circuit has an allocated filter level and further comprises a pulse level detection circuit configured to detect a change of state of a pulse level of the input signal, wherein the change of state comprises a transition from a first pulse level to a second pulse level, and
if the pulse level corresponds to the allocated filter level of the filter circuit the output of said filter circuit is activated, and wherein the pulse level detection circuit and/or the at least one of the filter circuits is configured as a field programmable gate array (FPGA) or other programmable logical elements.

2. Filter unit according to claim 1, characterized in that, the number of filter circuits corresponds to the number of pulse levels of the input signal.

3. Filter unit according to claim 1, characterized in that, the number of filter circuits corresponds to the number of pulse level transitions of the multi-pulse signal.

4. Filter unit for filtering multiple pulse signals comprising:
a number of filter circuits, which are connected in parallel, each filter circuit comprising an input and an output,
wherein the input is configured to receive an amplitude of an input signal and the output is configured to activate an output signal,
characterized in that,
each filter circuit has an allocated filter level and further comprises a pulse level detection circuit configured to detect a change of state of a pulse level of the input signal, wherein the change of state comprises a transition from a first pulse level to a second pulse level, and
if the pulse level corresponds to the allocated filter level of the filter circuit the output of said filter circuit is activated, and
wherein the pulse level detection circuit and/or at least one of the filter circuits comprise logical gate elements.

5. Filter unit according to claim 1, characterized in that, the pulse level detection circuit comprises at least one AND gate arranged to receive at least one pulse level and at least one allocated filter level.

6. Filter unit according to claim 1, characterized in that, the pulse level detection circuit is connected to a further input of the filter unit and the input is arranged to enable the output signal-at the output of the filter unit.

7. Filter unit according to claim 1, characterized in that, the filter unit further comprises a multiplexer, which is connected to the output of the filter circuits.

8. Filter unit according to claim 1, characterized in that, the filter unit is serially connected to at least one further filter unit.

9. Filter unit according to claim 1, characterized in that, the number of filter circuits is 4.

10. Filter unit according to claim 1, characterized in that, the number of filter circuits is 8.

11. Filter unit-according to claim 1, characterized in that, the filter unit further comprises means to store data into a memory device.

12. Filter unit for filtering multiple pulse signals comprising:
means to store data into a memory device,
a filter circuit comprising at least one input and an output,
wherein the at least one input is configured to receive an amplitude of the input signal and the output is configured to output signal information to the memory device,
characterized in that,
the filter circuit has, at a given time ($t_1$), an allocated filter value ($fv_1$) and further comprises at least one pulse level detection circuit arranged to detect a change of state of a prevailing pulse level of the input signal, wherein the change of state may comprise a transition from a first pulse level to a second pulse level, and
if the prevailing pulse level corresponds to the allocated filter value ($fv_1$) of the filter circuit, the output and the state of that filter circuit are stored in a memory $m_1$ of the memory device and the allocated filter value of the filter circuit is changed to a new value ($fv_2$) in order to detect a different change of state of a prevailing pulse level at a time $t_2$ later than $t_1$.

13. Method for filtering multiple pulse signals, using a filter unit according to claim 1, the method comprising:
detecting a change of state of a pulse level of the input signal, and
if the pulse level corresponds to the allocated filter level of the filter circuit activating the output of the allocated filter circuit.

14. Method for filtering multiple pulse signals,
wherein a filter unit comprises a number of filter circuits, which are connected in parallel, each filter circuit comprising an input and an output,
wherein the input is configured to receive an amplitude of an input signal and the output is configured to activate an output signal, each filter circuit has an allocated filter level and further comprises a pulse level detection circuit,
the method comprising:
detecting a change of state of a pulse level of the input signal, and
if the pulse level corresponds to the allocated filter level of the filter circuit activating the output of the allocated filter circuit,
wherein the pulse level detection circuit and/or at least one of the filter circuits comprise logical gate elements.

* * * * *